United States Patent
Weis

(10) Patent No.: US 11,307,236 B2
(45) Date of Patent: Apr. 19, 2022

(54) LOCATION OF A GROUND FAULT IN AN IT NETWORK

(71) Applicant: Siemens Aktiengesellschaft, Munich (DE)

(72) Inventor: Benno Weis, Hemhofen (DE)

(73) Assignee: SIEMENS AKTIENGESELLSCHAFT, Munich (DE)

( * ) Notice: Subject to any disclaimer, the term of this patent is extended or adjusted under 35 U.S.C. 154(b) by 0 days.

(21) Appl. No.: 16/634,048

(22) PCT Filed: Jun. 29, 2018

(86) PCT No.: PCT/EP2018/067617
§ 371 (c)(1),
(2) Date: Jan. 24, 2020

(87) PCT Pub. No.: WO2019/020316
PCT Pub. Date: Jan. 31, 2019

(65) Prior Publication Data
US 2020/0166558 A1    May 28, 2020

(30) Foreign Application Priority Data

Jul. 27, 2017   (EP) .................... 17183436

(51) Int. Cl.
*H02H 3/16*        (2006.01)
*G01R 31/08*       (2020.01)
(Continued)

(52) U.S. Cl.
CPC ............. *G01R 31/086* (2013.01); *H02H 3/16* (2013.01); *H02H 3/353* (2013.01);
(Continued)

(58) Field of Classification Search
CPC .......... H02H 3/16; H02H 3/162; H02H 3/165; H02H 3/167; H02H 7/1227; H02H 3/353; H02H 3/50; G01R 31/086
See application file for complete search history.

(56) References Cited

U.S. PATENT DOCUMENTS 9,604,543 B2 *  3/2017  Hu .................. H02P 29/032
2008/0084215 A1  4/2008  Itten et al.
(Continued)

FOREIGN PATENT DOCUMENTS

CN         1721869 A     1/2006
CN       101295671 A    10/2008
(Continued)

OTHER PUBLICATIONS

PCT International Preliminary Examination Report and Written Opinion of the International Examination Authority dated Feb. 10, 2019 corresponding to PCT International Application No. PCT/EP2018/067617 filed Jun. 29, 2018.

*Primary Examiner* — Harry R Behm
(74) *Attorney, Agent, or Firm* — Henry M. Feiereisen LLC

(57) ABSTRACT

A method for locating a ground fault in an IT network which has a converter with a rectifier connected to a power transmission network, a DC link and an inverter connected to an electrical machine includes measuring a common-mode voltage property of the converter or of the power transmission network and comparing the common-mode voltage property with an output voltage property of an output voltage of the inverter. When the IT network experiences a ground fault, the comparison of the common-mode voltage property with the output voltage property is used to determine whether a machine area of the IT network connected downstream of the converter, which includes the electrical machine and a connecting line between the electrical machine and the converter, causes the ground fault.

13 Claims, 2 Drawing Sheets

(51) Int. Cl.
*H02H 3/353* (2006.01)
*H02H 7/122* (2006.01)
*H02H 3/50* (2006.01)

(52) U.S. Cl.
CPC ........... *H02H 7/1227* (2013.01); *H02H 3/162* (2013.01); *H02H 3/50* (2013.01)

(56) References Cited

U.S. PATENT DOCUMENTS

| | | |
|---|---|---|
| 2008/0267235 A1 | 10/2008 | Ando et al. |
| 2012/0014020 A1* | 1/2012 | Lehmann ................ G01R 31/50 361/42 |
| 2012/0212172 A1 | 8/2012 | Valdez et al. |
| 2013/0170077 A1 | 7/2013 | Dillig et al. |
| 2013/0221997 A1 | 8/2013 | Garcia Alvarrez et al. |
| 2014/0049264 A1* | 2/2014 | Ganesh ................... G01R 31/52 324/551 |
| 2015/0097571 A1 | 4/2015 | Wei et al. |
| 2015/0210506 A1 | 7/2015 | Kattainen et al. |
| 2017/0131340 A1* | 5/2017 | Tallam ................... G01R 31/52 |
| 2018/0241200 A1* | 8/2018 | Hu ........................ H02H 1/0007 |
| 2020/0329543 A1* | 10/2020 | Shi ...................... H05B 45/3725 |

FOREIGN PATENT DOCUMENTS

| | | |
|---|---|---|
| CN | 102645607 A | 8/2012 |
| CN | 104768861 A | 7/2015 |
| DE | 102010030079 A1 | 12/2011 |
| EP | 2439827 A2 | 4/2012 |
| WO | WO 2017032992 A1 | 3/2017 |

\* cited by examiner

LOCATION OF A GROUND FAULT IN AN IT NETWORK

CROSS-REFERENCES TO RELATED APPLICATIONS

This application is the U.S. National Stage of International Application No. PCT/EP2018/067617, filed Jun. 29, 2018, which designated the United States and has been published as International Publication No. WO 2019/020316 A1 and which claims the priority of European Patent Application, Serial No. 17183436.9, filed Jul. 27, 2017, pursuant to 35 U.S.C. 119(a)-(d).

BACKGROUND OF THE INVENTION

The invention relates to a method for location of a ground fault in an IT network, which has a power transmission network, a rotating electrical machine and a converter that is connected on its input side to the power transmission network and on its output side to the rotating electrical machine.

In IT networks for electrical power supply it is basically permissible to continue to operate the IT network in the event of a simple ground fault. In IT networks which feature rotating electrical machines, which are connected to a power transmission network of the IT network via a converter in each case, this also applies for the case in which the ground fault occurs in the power transmission network. In this case it is merely the base frequency common-mode voltage of all connected consumers that increases.

However if the ground fault occurs in a machine area of the IT network, which has a rotating electrical machine and a connecting line between the electrical machine and the associated converter, then the pulse frequency output voltage of this converter will be applied to the entire IT network and thus also to all connected consumers. This can lead to consumers on the IT network becoming overloaded. Moreover it is possible for the electromagnetic radiation of the IT network to become impermissibly high and for it to interfere with neighboring electrical devices. This problem exists both in alternating current IT networks and also in direct current IT networks.

Usually a ground fault that occurs in a machine areas of an IT network is detected by an earth leakage monitor, which detects whether an impermissible common-mode current is flowing. As an alternative the ground fault can also be detected by a network voltage of the IT network being monitored in relation to a ground potential, and it being concluded that there is a ground fault hi a machine area of an IT network if the network voltage contains pulse frequency components. However the machine area of the IT network in which the ground fault is occurring cannot be determined with any of these methods. Therefore as a rule all consumers on the IT network are switched off when it is recognized that a ground fault is occurring in a machine area.

The underlying object of the invention is to specify an improved method for location of a ground fault hi an IT network, which in particular makes it possible to identify the machine area in which the ground fault is occurring.

SUMMARY OF THE INVENTION

In accordance with the invention, the object is achieved by a method for location of a ground fault in an IT network, which has a power transmission network, a rotating electrical machine and a converter, wherein the converter is connected on its input side to the power transmission network and on its output side to the rotating electrical machine and has a DC link circuit and an inverter connected to the DC link circuit and the electrical machine. In the method a common-mode voltage property of the converter or of the power transmission network is acquired, the common-mode voltage property is compared to an output voltage property of an output voltage of the inverter and, in the event of a ground fault in the IT network, on the basis of the comparison of the common-mode voltage property with the output voltage property, it is concluded whether a machine area connected downstream from the converter of the IT network, which has the electrical machine and a connecting line between the electrical machine and the converter, is the cause of the ground fault.

Advantageous embodiments of the invention are the subject matter of the dependent claims.

An inverter is always understood here and below to be an inverter that has pulse width modulation controlled electronic switching units.

The invention exploits the fact that, in the event of a ground fault in a machine area of the IT network, the output voltage of the inverter connected to the machine area influences the common-mode voltages of the converter having the inverter and of the power transmission network. Therefore, by comparing a output voltage property of an output voltage of the inverter with a common-mode voltage property of common-mode voltage of the converter or of the power transmission network corresponding thereto, it can be established whether a ground fault is occurring in the machine area connected to this inverter.

Since all converters of the IT network, which are each connected to a machine area, are monitored in this way, the machine area in which a ground fault is occurring can be determined. This makes it possible in particular to explicitly shut down that machine area in which a ground fault is occurring, so that the IT network can continue to be operated in the event of a ground fault in one machine area. The inventive method is therefore especially advantageous in IT networks that have a number of rotating electrical machines, which are each connected in accordance with claim 1 to the power transmission network of the IT network via a converter. The formulation of claim 1 that the IT network has a rotating electrical machine and a converter connected to said machine, is therefore not to be understood in the sense of the IT network having only one rotating electrical machine and a converter connected thereto, but that the IT network has at least one rotating electrical machine, which is connected via a converter, as claimed in claim 1, to the power transmission network of the IT network.

The inventive method can in particular be realized with little effort and therefore at low cost, since a component or device that lies in the power path of a rotating electrical machine is not required for carrying it out.

Embodiments of the invention make provision for voltage pulses of either a voltage between a link circuit potential of the DC link circuit of the converter and a ground potential or a network voltage of the power transmission network to be acquired as the common-mode voltage property in relation to the ground potential, for switching actions of a phase of the inverter to be used as the output voltage property and for it to be concluded that the machine area is the source of the fault if the voltage pulses occur at the same time as the switching actions.

These embodiments of the invention exploit the fact that, in the event of a ground fault in one machine area of the IT network, the voltage at the DC voltage link circuit of the converter connected to this machine area and the network voltage of the power transmission network of the IT network (in relation to the ground potential in each case) have the pulse frequency output voltage of the inverter of this converter applied to them. Therefore a ground fault in one machine area of the IT network can be recognized by a temporal match between voltage pulses of the voltage at the DC voltage link circuit or the network voltage and the switching actions of a phase of the inverter connected to the machine area.

A further embodiment of the embodiments of the invention already mentioned makes provision for a threshold period to be predetermined and for a voltage pulse to be defined as being at the same time as a switching action if a time gap between the voltage pulse and the switching action is less than the threshold period. For example a threshold period is predetermined that is less than 10 µs.

This further embodiment of the invention takes into account the fact that the voltage pulses follow the switching actions with a slight time delay. The threshold period further enables measurement errors during the determination of the temporal correlation of the voltage pulses and the switching actions to be compensated for.

Another further embodiment of the aforementioned embodiments of the invention makes provision for a count duration, of around a second for example, and a number threshold value, of around 1000 for example, to be predetermined and within the count duration for an evaluation number of simultaneous voltage pulses and switching actions to be acquired, and for it to be concluded that the machine area is the cause of the ground fault if the evaluation number exceeds the number threshold value.

This further embodiment of the invention takes account of the fact that the switching actions are pulse-type actions and therefore voltage pulses caused by the switching actions are likewise in the form of pulses. A ground fault in a machine area therefore causes a plurality of voltage pulses following one another at short intervals, which in addition are correlated with the switching actions of the inverter connected to the machine area. It can then be especially reliably concluded that the machine area is the cause of the ground fault if the pulse patterns of the voltage pulses and the switching action largely match. Such a match is quantified by the number threshold value for voltage pulses and switching actions occurring simultaneously within the period.

Other further embodiments of the aforementioned embodiments of the invention make provision for the switching actions of a phase of the inverter to be established either from a measurement of the output voltage of the phase in relation to the DC link circuit potential of the DC link circuit or from activation signals for activating the phase.

In these further embodiments of the invention the switching actions of a phase of the inverter are thus established either from a measurement of the output voltage of the phase or from activation signals for activating the phase. The acquisition of the switching actions through a measurement of the output voltage makes possible a reliable determination of the switching actions actually occurring. On the other hand the establishment of the switching actions from the activation signals for activating the phase has the advantage that the output voltage of the phase does not have to be measured.

A further embodiment of the invention makes provision for a frequency spectrum of a network voltage of the power transmission network against a ground potential to be acquired as the common-mode voltage property, for a basic output frequency of the output voltage of the inverter to be used as the output voltage property and for it to be concluded that the machine area is the cause of the fault if the frequency spectrum of the network voltage has a spectral component that matches the basic output frequency. In the case of a multiphase power transmission network a phase voltage or the sum of all phase voltages of the power transmission network in relation to a ground potential are used as a phase voltage for example.

This embodiment of the invention exploits the fact that, in the event of ground fault in a machine area of the IT network, the basic output frequency of the output voltage of the converter in the power transmission network of the IT network is transmitted, so that the phase voltages of the power transmission network in relation to a ground potential not only contain a spectral component at its operating frequency (e.g. 50 Hz or 60 Hz) but also a spectral component at the basic output frequency of the machine area affected by the ground fault. Therefore a ground fault in a machine area of the IT network can also be recognized by the frequency spectrum of the network voltage of the power transmission network having a spectral component that matches the basic output frequency of the output voltage of the inverter connected to the machine area.

Further embodiments of the aforementioned embodiment of the invention make provision for a required basic frequency of the output voltage of the inverter to be used as the basic output frequency or for the basic output frequency to be measured.

The measurement of the basic output frequency makes possible a reliable determination of the basic output frequency. By contrast the use of a required basic frequency of the output voltage of the inverter as basic output frequency has the advantage of the basic output frequency not having to be measured.

A further embodiment of the invention makes provision for a frequency spectrum of a network voltage of the power transmission network in relation to a ground potential to be acquired as the common-mode voltage property, for a switching frequency of the output voltage of the inverter to be used as the output voltage property and for it to be concluded that the machine area is the cause of the ground fault if the frequency spectrum of the network voltage has a spectral component matching the switching frequency of the output voltage of the inverter.

This embodiment of the invention can in particular be combined with the embodiments previously described in such a way that it can be concluded that a machine area is the cause of the ground fault if the frequency spectrum of the network voltage contains both a spectral component at the required basic frequency of the output voltage and also a spectral component at the switching frequency of the inverter. This evaluation of the frequency spectrum offers the advantage of a machine area being able to be uniquely identified as the cause of the ground fault even if the output voltages of two converters have the same required basic frequencies but have different switching frequencies or have identical switching frequencies but have different required basic frequencies.

Further embodiments of the invention make provision for a control unit of the converter to block the activation of the converter or for a higher-ranking network control unit of the IT network to block the converter if it is concluded that the machine area is the cause of the ground fault.

These embodiments of the invention make it possible for a machine area to shut down by the control unit of the associated converter or by the associated converter being blocked by a higher-ranking network control unit of the IT network if it is concluded that the machine area is the cause of the ground fault.

BRIEF DESCRIPTION OF THE DRAWING

The properties, features and advantages of this invention described above as well as the manner in which these are achieved will become clearer and easier to understand in conjunction with the description given below of exemplary embodiments, which will be explained in greater detail in conjunction with a drawing in which.

DETAILED DESCRIPTION OF PREFERRED EMBODIMENTS

Figure 1:
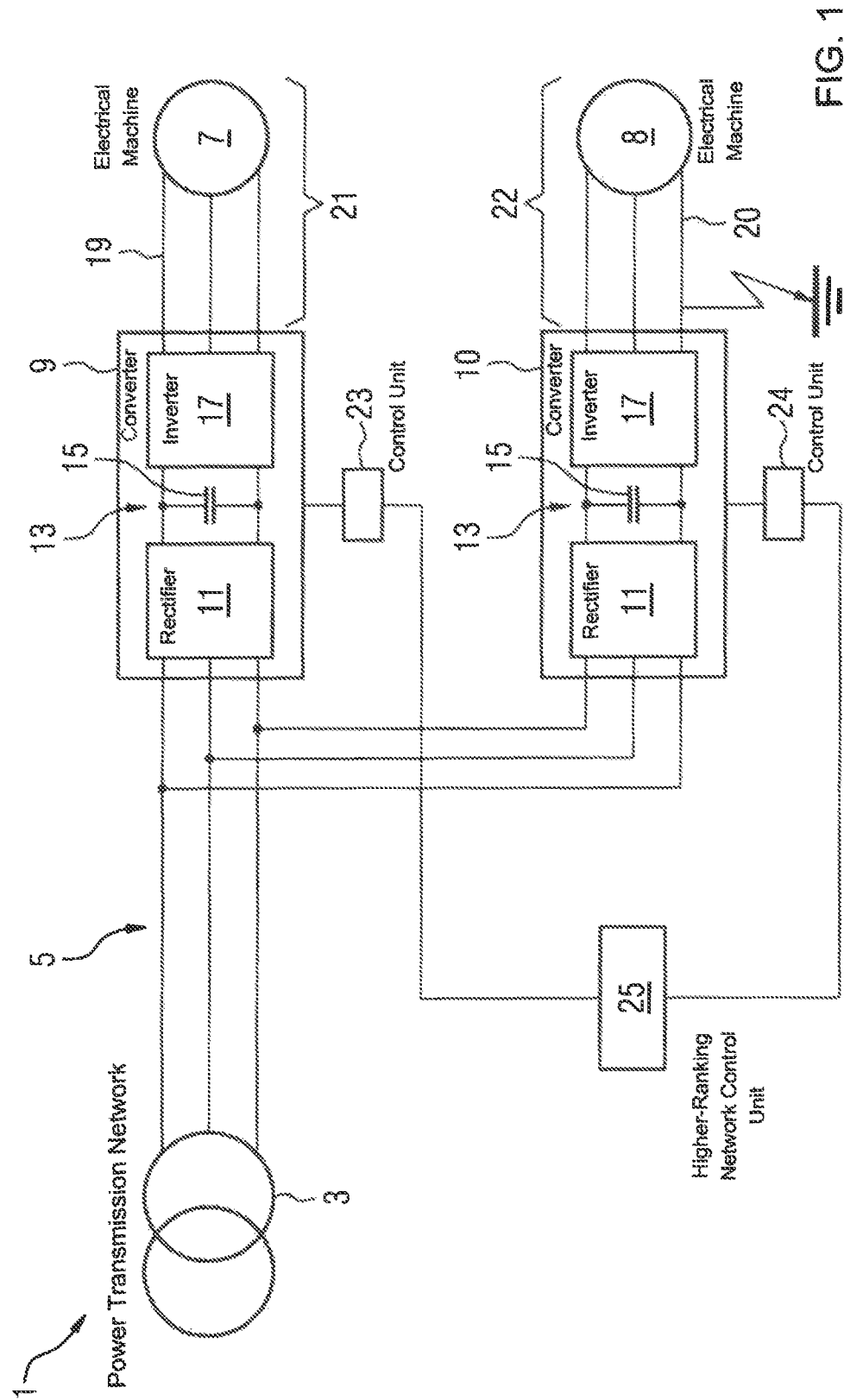
FIG. 1 shows a schematic of an IT network.
Figures 2A, 2B:
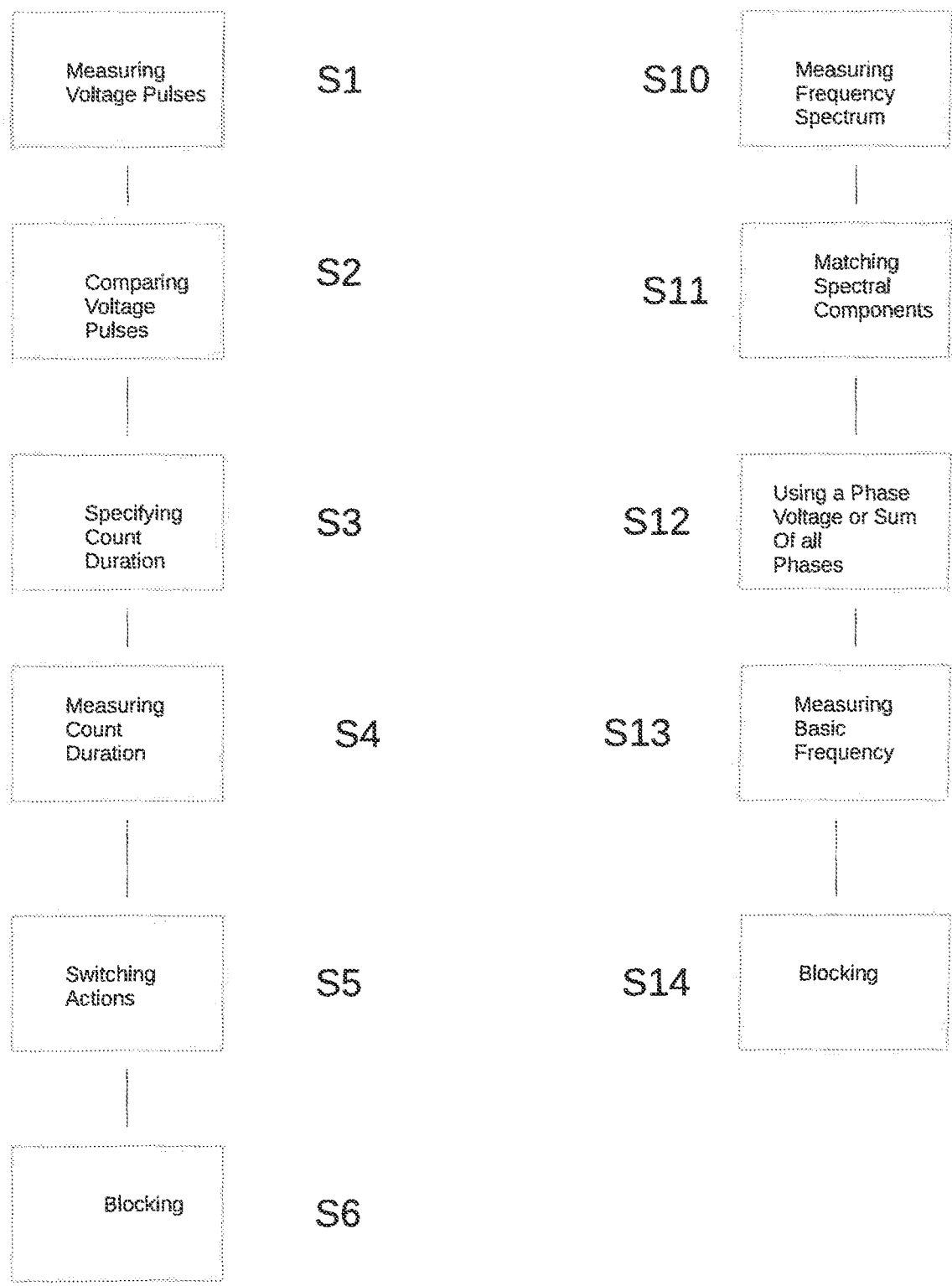
FIGS. 2A and 2B show flowcharts for the operation of the IT network.

In the drawing FIG. 1 shows a schematic of an IT network 1 with a power source 3, a power transmission network 5 and two rotating electrical machines 7, 8, which are each connected to the power transmission network 5 via a converter 9, 10.

The power transmission network 5 of the IT network 1 shown in FIG. 1 is a three-phase alternating current network. Each electrical machine 7, 8 is a three-phase electric motor for example.

Each converter 9, 10 is connected on its input side to the power transmission network 5 and on its output side to an electrical machine 7, 8. Each converter 9, 10 is further embodied as a converter having an input-side three-phase rectifier 11, a DC link circuit 13 with a link circuit capacitor 15 and an output-side inverter 17. The three-phase rectifier 11 is connected to the power transmission network 5 and the DC link circuit 13. The inverter 17 is connected to the DC link circuit 13 and to the respective electrical machine 7, 8.

A first electrical machine 7 is connected via first connecting lines 19 to a first converter 9. The first electrical machine 7 and the first connecting lines 19 define a first machine area 21 of the IT network 1.

The second electrical machine 8 is connected via second connecting lines 20 to the second converter 10. The second electrical machine 8 and the second connecting lines 20 define a second machine area 22 of the IT network 1.

The inventive method serves to recognize a ground fault in a machine area 21, 22 and to detect the machine area 21, 22 in which the ground fault is occurring, in order to explicitly shut down this machine area 21, 22 and thus be able to continue to operate the rest of the IT network 1. In FIG. 1 a ground fault in the second machine area 22 is indicated by a lightning symbol.

A first exemplary embodiment of the method makes provision that, for each converter 9, 10, voltage pulses of a voltage between a link circuit potential of the DC link circuit 13 and a ground potential are acquired S1 and are compared S2 with switching actions of a phase of the inverter 17 of the respective converter 9, 10. If for one of the converters 9, 10 the acquired voltage pulses occur at the same time as the switching actions, it is concluded that a ground fault in the machine area 21, 22 connected to this converter 9, 10 is the cause of a ground fault.

In this case for example a threshold period is predetermined and a voltage pulse is defined as being simultaneous with a switching action if a time gap between the voltage pulse and the switching action is less than the threshold period. For example a threshold period is predetermined that is less than 10 μs.

A count duration S3, of around a second for example, and a number threshold value, of around 1000 for example, are further predetermined and within the count duration an evaluation number of simultaneous voltage pulses and switching actions is acquired S4. It is only concluded that a machine area 21, 22 is the cause of the ground fault if, for the converter 9, 10 connected to this machine area 21, 22, the evaluation number exceeds the number threshold value.

The switching actions of a phase of the inverter 17 of a converter 9, 10 are acquired by a measurement S5 of the output voltage of the phase in relation to a link circuit potential of the DC link circuit of the converter 9, 10 or established as activation signals for activating the phase.

A second exemplary embodiment of the method essentially only differs from the first exemplary embodiment in that, instead of voltage pulses of the voltages at the DC link circuits 13 of the converters 9, 10, voltage pulses of a network voltage of the power transmission network in relation to a ground potential are acquired and compared in each case with switching actions of a phase of the inverter 17 of each converter 9, 10. If, for one of the converters 9, 10, the acquired voltage pulses occur at the same time as the switching actions, it is concluded that the machine area 21, 22 connected to this converter 9, 10 is the cause of a ground fault. Embodiments of this exemplary embodiment in respect of the definition and recognition of simultaneous voltage pulses and switching actions and also the establishment of the switching actions of a phase of an inverter 17 correspond to the embodiments of the first exemplary embodiment given above.

In a third exemplary embodiment of the method a frequency spectrum of a network voltage of the power transmission network in relation to a ground potential is acquired S10 and is compared S11 with the basic output frequency and/or the switching frequency of the output voltage of the inverter 17 of each converter 9, 10. If the output voltages of the inverter 17 of the converters 9, 10 have different basic output frequencies, it is concluded that a machine area 21, 22 is the cause of a ground fault, if the acquired frequency spectrum has a spectral component that matches the basic output frequency of the output voltage of the inverter 17 of that converter 9, 10 that is connected to this machine area 21, 22. If the output voltages of the inverters 17 of the converters 9, 10 have the same basic output frequencies but different switching frequencies, it is concluded that a machine area 21, 22 is the cause of a ground fault if the acquired frequency spectrum has a spectral component that matches the switching frequency of the output voltage of the inverter 17 of that converter 9, 10 that is connected to this machine area 21, 22.

In the case shown in FIG. 1 of a multiphase power transmission network 5 a phase voltage or the sum of all phase voltages of the power transmission network 5 in relation to a ground potential is used as the network voltage S12.

A required basic frequency of the output voltage of the inverter 17 is used as the basic output frequency of the output voltage of an inverter 17 or the basic output frequency is measured S13.

In all of the exemplary embodiments given above a machine area 21, 22 in which a ground fault is recognized is shut down for example by a control unit 23, 24 of the converter 9, 10 connected to this machine area 21, 22 blocking the activation of the converter 9, 10, or by a higher-ranking network control unit 25 of the IT network 1 blocking S6, S14 the converter 9, 10 connected to this machine area 21, 22.

All exemplary embodiments of the method given above can also be applied by analogy to an IT network 1 of which the power transmission network 5 is a direct current network.

Although the invention has been illustrated and described in greater detail by preferred exemplary embodiments, the invention is not restricted by the examples disclosed and other variations can be derived herefrom by the person skilled in the art, without departing from the scope of protection of the invention.

The invention claimed is:

1. A method for locating a ground fault in an IT network comprising a converter having a rectifier connected at an input side to a power transmission network, and an inverter connected at an output side to a rotating electrical machine, and a DC link circuit connected between the rectifier and the inverter, said method comprising:
   measuring voltage pulses of a voltage between a DC link circuit potential of the DC link circuit and a ground potential or voltage pulses of a network voltage of the power transmission network and the ground potential;
   comparing the measured voltage pulses with switching actions of a phase of the inverter;
   specifying a count duration and a threshold value for a number of occurrences of the measured voltage pulses,
   measuring within the count duration an evaluation number of simultaneous voltage pulses and switching actions; and
   when the IT network experiences a ground fault and the evaluation number exceeds the threshold value for the number of occurrences, concluding that a machine area of the IT network connected downstream of the converter, which includes the electrical machine and a connecting line between the electrical machine and the converter, causes the ground fault.

2. The method of claim 1, further comprising specifying a threshold period and defining that a voltage pulse occurs simultaneous with a switching action when a time interval between the voltage pulse and the switching action is less than the specified threshold period.

3. The method of claim 2, wherein the specified threshold period is less than 10 µs.

4. The method of claim 1, further comprising determining the switching actions of the phase of the inverter by measuring an output voltage of the phase against a link circuit potential of the DC link circuit.

5. The method of claim 1, wherein the switching actions of the phase of the inverter are determined from activation signals activating the phase.

6. The method claim 1, further comprising blocking, with a control unit, activation of the converter when it is concluded that the machine area connected downstream of the converter causes the ground fault.

7. The method of claim 1, further comprising blocking the converter with a higher-ranking network control unit of the IT network when it is concluded that the machine area connected downstream of the converter causes the ground fault.

8. A method for locating a ground fault in an IT network comprising a converter having a rectifier connected at an input side to a power transmission network, and an inverter connected at an output side to a rotating electrical machine, and a DC link circuit connected between the rectifier and the inverter, the method comprising:
   measuring a frequency spectrum of a network voltage of the power transmission network in relation to a ground potential; and
   when the IT network experiences a ground fault and the frequency spectrum of the network voltage has both a spectral component matching a basic output frequency of an output voltage of the inverter and a spectral component matching a switching frequency of the inverter, concluding that a machine area of the IT network connected downstream of the converter, which includes the electrical machine and a connecting line between the electrical machine and the converter, causes the ground fault.

9. The method of claim 8, further comprising, when the power transmission network is a multiphase power transmission network, using as the network voltage a phase voltage or a sum of all phase voltages of the power transmission network in relation to a ground potential.

10. The method of claim 8, wherein the basic output frequency is a required basic frequency of the output voltage of the inverter.

11. The method of claim 8, further comprising measuring the basic output frequency.

12. The method claim 8, further comprising blocking, with a control unit, activation of the converter when it is concluded that the machine area connected downstream of the converter causes the ground fault.

13. The method of claim 8, further comprising blocking the converter with a higher-ranking network control unit of the IT network when it is concluded that the machine area connected downstream of the converter causes the ground fault.

* * * * *